(12) United States Patent
Cho

(10) Patent No.: US 9,331,005 B2
(45) Date of Patent: May 3, 2016

(54) POWER SEMICONDUCTOR PACKAGE WITH MULTI-SECTION CONDUCTIVE CARRIER

(71) Applicant: International Rectifier Corporation, El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/826,103

(22) Filed: Aug. 13, 2015

(65) Prior Publication Data

US 2015/0348884 A1 Dec. 3, 2015

Related U.S. Application Data

(63) Continuation of application No. 14/488,747, filed on Sep. 17, 2014, now Pat. No. 9,111,776, and a continuation-in-part of application No. 14/022,584, filed on Sep. 10, 2013, now Pat. No. 9,111,921.

(60) Provisional application No. 61/901,987, filed on Nov. 8, 2013, provisional application No. 61/715,737, filed on Oct. 18, 2012.

(51) Int. Cl.
*H01L 23/495* (2006.01)
*H01L 25/07* (2006.01)
(Continued)

(52) U.S. Cl.
CPC ...... *H01L 23/49558* (2013.01); *H01L 21/4803* (2013.01); *H01L 21/4825* (2013.01); *H01L 21/4839* (2013.01); *H01L 21/4853* (2013.01); *H01L 21/4871* (2013.01); *H01L 21/56* (2013.01); *H01L 21/561* (2013.01); *H01L 23/041* (2013.01); *H01L 23/12* (2013.01); *H01L 23/3121* (2013.01); *H01L 23/3157* (2013.01); *H01L 23/492* (2013.01); *H01L 23/4952* (2013.01); *H01L 23/49524* (2013.01); *H01L 23/49562* (2013.01); *H01L 23/49568* (2013.01); *H01L 23/49575* (2013.01); *H01L 24/24* (2013.01); *H01L 24/33* (2013.01);
(Continued)

(58) Field of Classification Search
CPC .............. H01L 21/4832; H01L 23/49568; H01L 23/49548; H01L 23/49575
See application file for complete search history.

(56) References Cited

U.S. PATENT DOCUMENTS

| 2011/0049690 A1* | 3/2011 | Cho | ............... H01L 21/4832 257/676 |
|---|---|---|---|
| 2012/0181624 A1 | 7/2012 | Cho | |
| 2012/0181674 A1 | 7/2012 | Cho | |

*Primary Examiner* — Kyoung Lee
(74) *Attorney, Agent, or Firm* — Farjami & Farjami LLP

(57) ABSTRACT

In one implementation, a power semiconductor package includes a non-contiguous, multi-section conductive carrier. A control transistor with a control transistor terminal is coupled to a first section of the multi-section conductive carrier, while a sync transistor with a sync transistor terminal is coupled to a second section of the multi-section conductive carrier. The first and second sections of the multi-section conductive carrier sink heat generated by the control and sync transistors. The first and second sections of the multi-section conductive carrier are electrically connected only through a mounting surface attached to the power semiconductor package. Another implementation of the power semiconductor package includes a driver IC coupled to a third section of the multi-section conductive carrier. A method for fabricating the power semiconductor package is also disclosed. The power semiconductor package according to the present disclosure results in effective thermal protection, current carrying capability, and a relatively small size.

20 Claims, 7 Drawing Sheets

(51) Int. Cl.
  *H01L 23/00* (2006.01)
  *H01L 23/31* (2006.01)
  *H01L 23/12* (2006.01)
  *H01L 21/48* (2006.01)
  *H01L 21/56* (2006.01)
  *H01L 25/11* (2006.01)
  *H01L 25/16* (2006.01)
  *H01L 23/492* (2006.01)
  *H01L 23/04* (2006.01)

(52) U.S. Cl.
  CPC ............... *H01L 24/73* (2013.01); *H01L 24/82* (2013.01); *H01L 24/92* (2013.01); *H01L 25/072* (2013.01); *H01L 25/117* (2013.01); *H01L 25/16* (2013.01); *H01L 24/16* (2013.01); *H01L 24/29* (2013.01); *H01L 24/83* (2013.01); *H01L 2224/16245* (2013.01); *H01L 2224/24137* (2013.01); *H01L 2224/24245* (2013.01); *H01L 2224/293* (2013.01); *H01L 2224/2929* (2013.01); *H01L 2224/29101* (2013.01); *H01L 2224/32245* (2013.01); *H01L 2224/73259* (2013.01); *H01L 2224/73267* (2013.01); *H01L 2224/82106* (2013.01); *H01L 2224/8382* (2013.01); *H01L 2224/8384* (2013.01); *H01L 2224/83801* (2013.01); *H01L 2224/83851* (2013.01); *H01L 2224/92224* (2013.01); *H01L 2224/92244* (2013.01); *H01L 2924/1032* (2013.01); *H01L 2924/1033* (2013.01); *H01L 2924/12042* (2013.01); *H01L 2924/13091* (2013.01); *H01L 2924/1426* (2013.01); *H01L 2924/181* (2013.01); *H01L 2924/1815* (2013.01)

POWER SEMICONDUCTOR PACKAGE WITH MULTI-SECTION CONDUCTIVE CARRIER

The present application is a continuation of parent application Ser. No. 14/488,747 filed Sep. 17, 2014, which itself claims priority to U.S. Provisional Patent Application Ser. No. 61/901,987, filed Nov. 8, 2013. Parent application Ser. No. 14/488,747 filed Sep. 17, 2014 is also a continuation in part of application Ser. No. 14/022,584, filed Sep. 10, 2013, which itself claims priority to U.S. Provisional Patent Application Ser. No. 61/715,737, filed Oct. 18, 2012. The disclosures in the above-identified patent applications are hereby incorporated fully by reference into the present application. The present application claims priority to all of these earlier filed applications.

BACKGROUND

Background Art

Semiconductor packages used in power applications employ power transistors, and are required to operate under high voltage and potentially high temperature conditions. For example, power transistors in voltage converters, sometimes referred to as control and sync transistors, generate substantial heat during operation. The potentially damaging heat can be diverted away from control and sync transistors using a heat spreader, which is often relatively large. In addition, the connection between the control transistor and the sync transistor provides a switch node and is typically implemented using a conductive clip, such as a copper clip, which must be sufficiently robust to accommodate high current. Moreover, because the control and sync transistors can be very sensitive to electrical resistance, the cross-sectional area of the conductive clip used to provide the switch node need be relatively large.

Consequently, packages in power applications, such as voltage converter power semiconductor packages, must typically be sized to accommodate not only control and sync transistors, but a large heat spreader providing thermal protection for those power transistors, and a large conductive clip for their connection, as well. Using heat spreaders and conductive clips require much additional space, and significantly increase the size of power semiconductor packages.

SUMMARY

The present disclosure is directed to a power semiconductor package with non-contiguous, multi-section conductive carrier, substantially as shown in and/or described in connection with at least one of the figures, and as set forth more completely in the claims.

DETAILED DESCRIPTION

Figure 1:
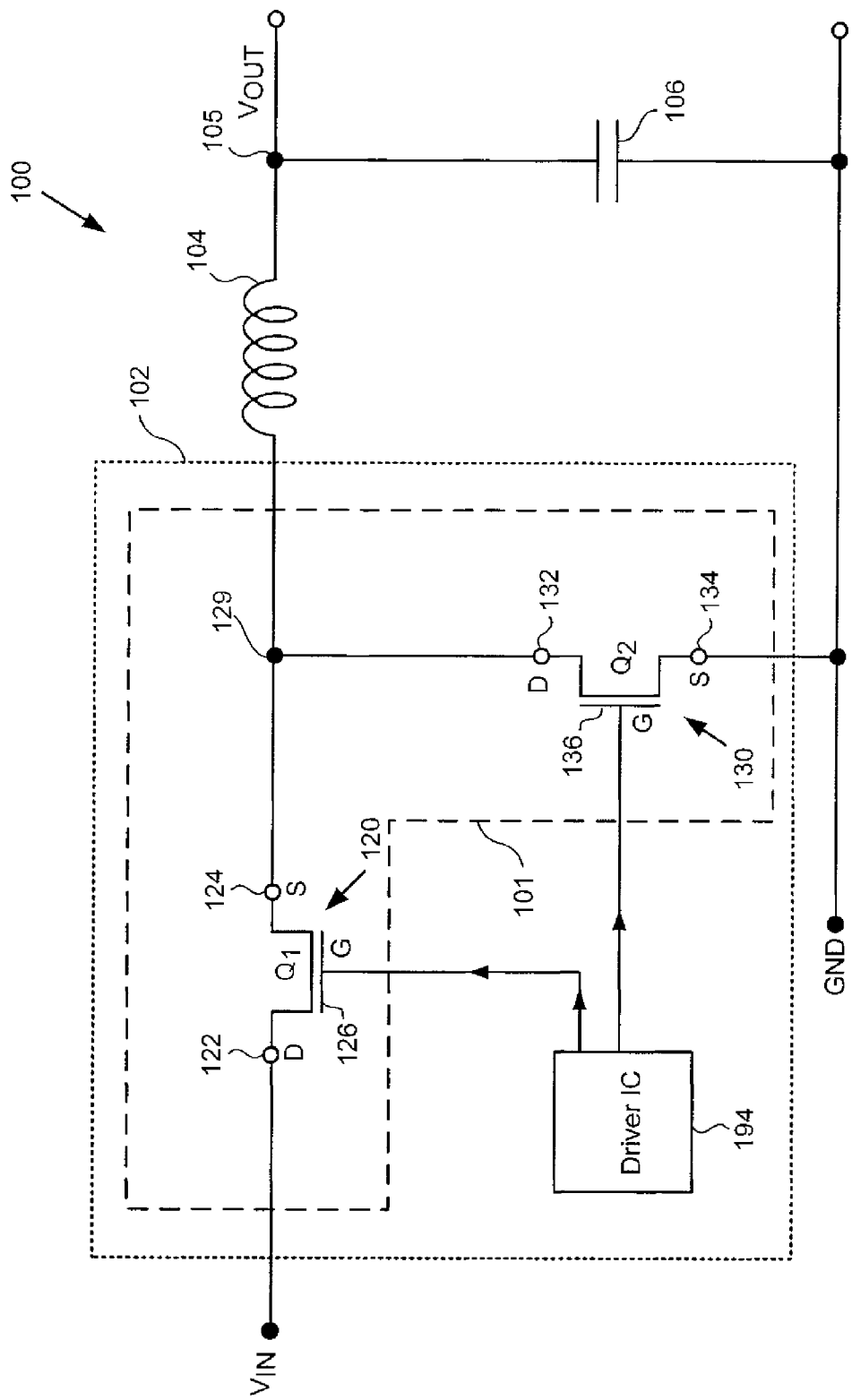
FIG. 1 shows a diagram of an exemplary circuit suitable for use as a voltage converter.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Power converters, such as voltage regulators, are used in a variety of electronic circuits and systems. For instance, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

FIG. 1 shows a diagram of an exemplary circuit suitable for use as a voltage converter. Voltage converter 100 includes voltage converter multi-chip module (MCM) 102, output inductor 104, and output capacitor 106. As shown in FIG. 1, MCM 102 includes power switching stage 101 of voltage converter 100, and driver IC 194 implemented to provide drive signals to power switching stage 101. As shown in FIG. 1, voltage converter 100 is configured to receive an input voltage $V_{IN}$, and to provide a converted voltage, e.g., a rectified and/or stepped down voltage, as $V_{OUT}$ at output 105.

Power switching stage 101 may be implemented using two power switches in the form of metal-oxide-semiconductor field-effect transistors (MOSFETs) configured as a half bridge, for example. That is to say, power switching stage 101 may include high side or control switch 120 ($Q_1$) having drain 122, source 124, and gate 126, as well as low side or sync switch 130 ($Q_2$) having drain 132, source 134, and gate 136. Control switch 120 is coupled to sync switch 130 at switch node 129, which, in turn, is coupled to output 105 through output inductor 104. Respective control and sync switches 120 and 130 may be implemented as group IV based power transistors, such as silicon power MOSFETs having a vertical design, for example. Voltage converter 100 may be advantageously utilized, for example as a buck converter, in a variety of automotive, industrial, appliance, and lighting applications.

It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors. It is noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

Power switches such as control and sync switches 120 and 130 are capable of generating substantial heat during operation. The potentially damaging heat can be diverted away from control and sync switches 120 and 130 using a heat spreader, which is often relatively large. In addition, the connection between control switch 120 and sync switch 130 providing switch node 129 is typically implemented using a conductive clip, such as a copper clip, which must be sufficiently robust to accommodate high current. Moreover, because control switch 120 and sync switch 130 can be highly sensitive to electrical resistance, the cross-sectional area of the conductive clip used to provide switch node 129 may also be relatively large. Consequently, packaging solutions for power switching stage 101 and/or MCM 102 must typically be sized to accommodate not only control and sync switches 120 and 130, but a large heat spreader providing thermal protection for those power switches, and a large conductive clip for their connection, as well.

Figure 2:
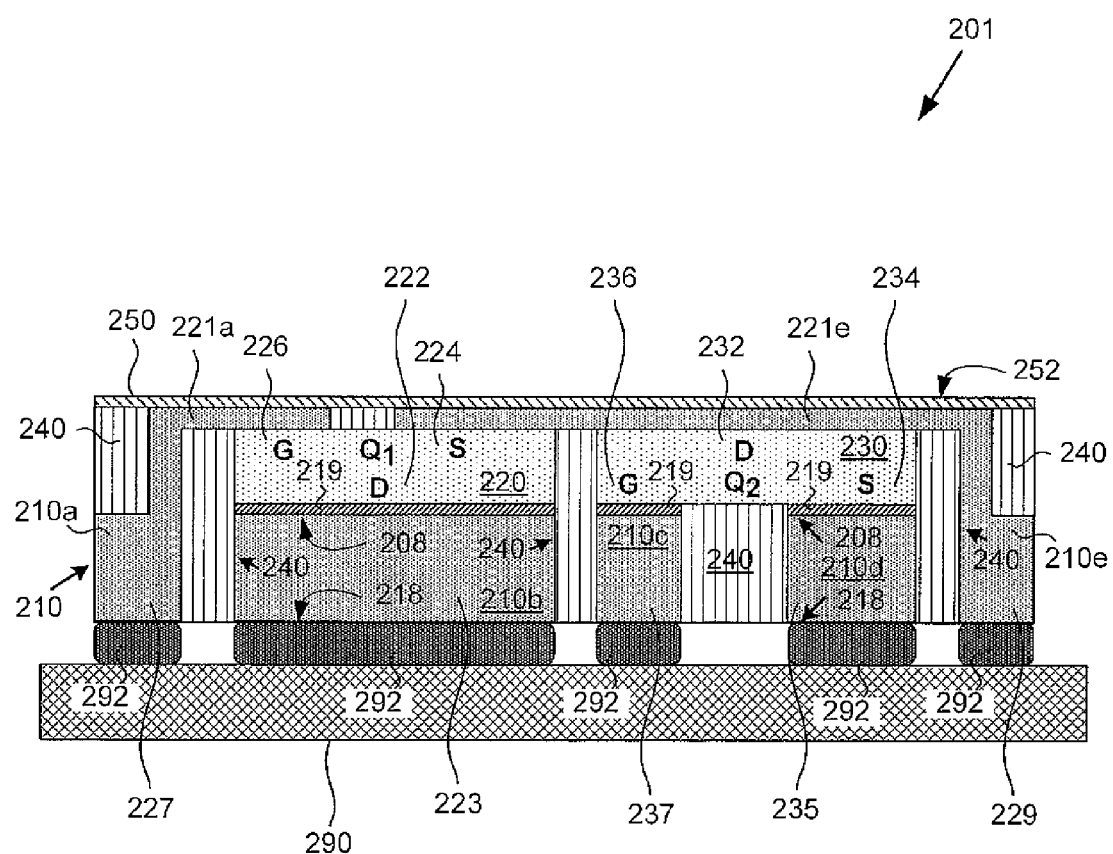
FIG. 2 shows an exemplary representation of a packaging solution according to one implementation of the present disclosure.

The present application discloses a packaging solution enabling omission of the aforementioned heat spreader and switch node conductive clip, while concurrently providing thermal protection for control and sync switches 120 and 130, and also providing a reliable, low resistance, and substantially parasitic free electrical connection for establishing switch node 129. In one implementation, power switching stage 101 is embedded in a conductive carrier utilized as a structural support in the packaging solution, such as a conductive lead frame for example, which is configured to provide integrated heat spreading. In addition, the support structure used to provide the conductive carrier can also be used to provide switch node 129. FIG. 2 shows an exemplary representation of a packaging solution according to one implementation of the present disclosure.

FIG. 2 shows a cross-sectional view of semiconductor package 201 attached to mounting surface 290, which may be a printed circuit board (PCB) for example, by solder bodies 292. Semiconductor package 201 includes fully patterned or multi-section conductive carrier 210, which itself includes conductive carrier sections 210a, 210b, 210c, 210d, and 210e (hereinafter "conductive carrier sections 210a-210e"). As shown in FIG. 2, the fully patterned or multi-section conductive carrier 210 is a non-contiguous conductive carrier, and is made up of patterned and disjointed sections that are housed within semiconductor package 201, and that are in electrical communication only through mounting surface 290. As shown in FIG. 2, conductive carrier 210 has die side 208, and opposite input/output (I/O) side 218 connecting semiconductor package 201 to mounting surface 290. The non-contiguous, fully patterned or multi-section conductive carrier 210, is also referred to simply as "conductive carrier" in the present application.

Semiconductor package 201 further includes control FET 220 ($Q_1$) having drain 222, source 224, and gate 226, as well as sync FET 230 ($Q_2$) having drain 232, source 234, and gate 236. Control FET 220 and sync FET 230 are specific examples of power transistors used for illustrative purposes in the present application. However, it is manifest that other types of power transistors can be used as well without departing from the scope of the present inventive concepts. Thus, control FET 220 may be referred to as control transistor and sync FET 230 may be referred to as sync transistor in the present application. Source, drain, and gate of either control FET and/or sync FET may be referred to as a transistor terminal. A control transistor terminal may refer to source, drain, or gate of the control transistor, i.e. control FET 220 in the present example. Likewise, a sync transistor terminal may refer to source, drain, or gate of the sync transistor, i.e. sync FET 230 in the present example. Moreover, semiconductor package 201 may be referred to as a "power semiconductor package" in the present application.

As shown in FIG. 2, drain 222 of control FET 220 is attached to die side 208 of conductive carrier section 210b, and source 234 of sync FET 230 is attached to die side 208 of conductive carrier section 210d. As further shown in FIG. 2, conductive carrier section 210a includes conductive carrier buildup region 221a, conductive carrier section 210c is attached to gate 236 of sync FET 230, and conductive carrier section 210e includes conductive carrier buildup region 221e. In addition, semiconductor package 201 includes electrically conductive die attach material 219, patterned dielectric 240, and insulator layer 250 providing surface 252.

Also included as part of semiconductor package 201 are drain contact 223 provided by conductive carrier section 210b, source contact 235 provided by conductive carrier section 210d, gate contacts 227 and 237 provided by respective conductive carrier sections 210a and 210c, and switch node contact 229 provided by conductive carrier section 210e. Conductive carrier section 210e is also referred to as a switch node section of the conductive carrier. It is noted that in addition to providing drain contact 223, conductive carrier section 210b is configured to sink heat produced by control FET 220 into mounting surface 290. Moreover, in addition to providing source contact 235, conductive carrier section 210d is configured to sink heat produced by sync FET 230 into mounting surface 290. It is further noted that conductive carrier section 210e is configured to provide switch node contact 229, as well as to provide integrated heat spreading functionality for dissipation of heat generated by control and sync FETs 220 and 230. In general, conductive carrier sections 210a, 210b, 210c, 210d, and 210e provide electrical contacts as well as integrated heat spreading by sinking heat produced by control FET 220 and sync FET 230 into mounting surface 290.

Semiconductor package 201 corresponds in general to power switching stage 101 in FIG. 1. In addition, control FET 220 having drain 222, source 224, and gate 226, and sync FET 230 having drain 232, source 234, and gate 236, correspond in general to control switch 120 having drain 122, source 124, and gate 126, and sync switch 130 having drain 132, source 134, and gate 136, respectively, in FIG. 1. Moreover, switch node contact 229, in FIG. 2, corresponds to switch node 129, in FIG. 1.

The features of semiconductor package 201 will be described in greater detail by reference to FIG. 3, and FIGS.

4A, 4B, 4C, 4D, 4E, and 4F (hereinafter "FIGS. 4A-4F"). However, it is noted in reference to FIG. 2 that the electrical connection between source 224 of control FET 220 and drain 232 of sync FET 230 is established in the absence of a conductive clip or other feature implemented solely or primarily as an electrical connector. Instead, according to the implementation shown in FIG. 2, the electrical connection between source 224 and drain 232 establishing switch node contact 229 is advantageously provided by conductive carrier section 210e, which includes conductive buildup region 221e. As a result, the packaging solution of FIG. 2 provides a robust, low resistance, and low parasitic connection for providing switch node contact 229. Moreover, the inventive concepts disclosed by the packaging solution represented in FIG. 2 can be extended to enable the fabrication of high density MCM packages, with reduced parasitics and improved thermal performance.

Figure 3:
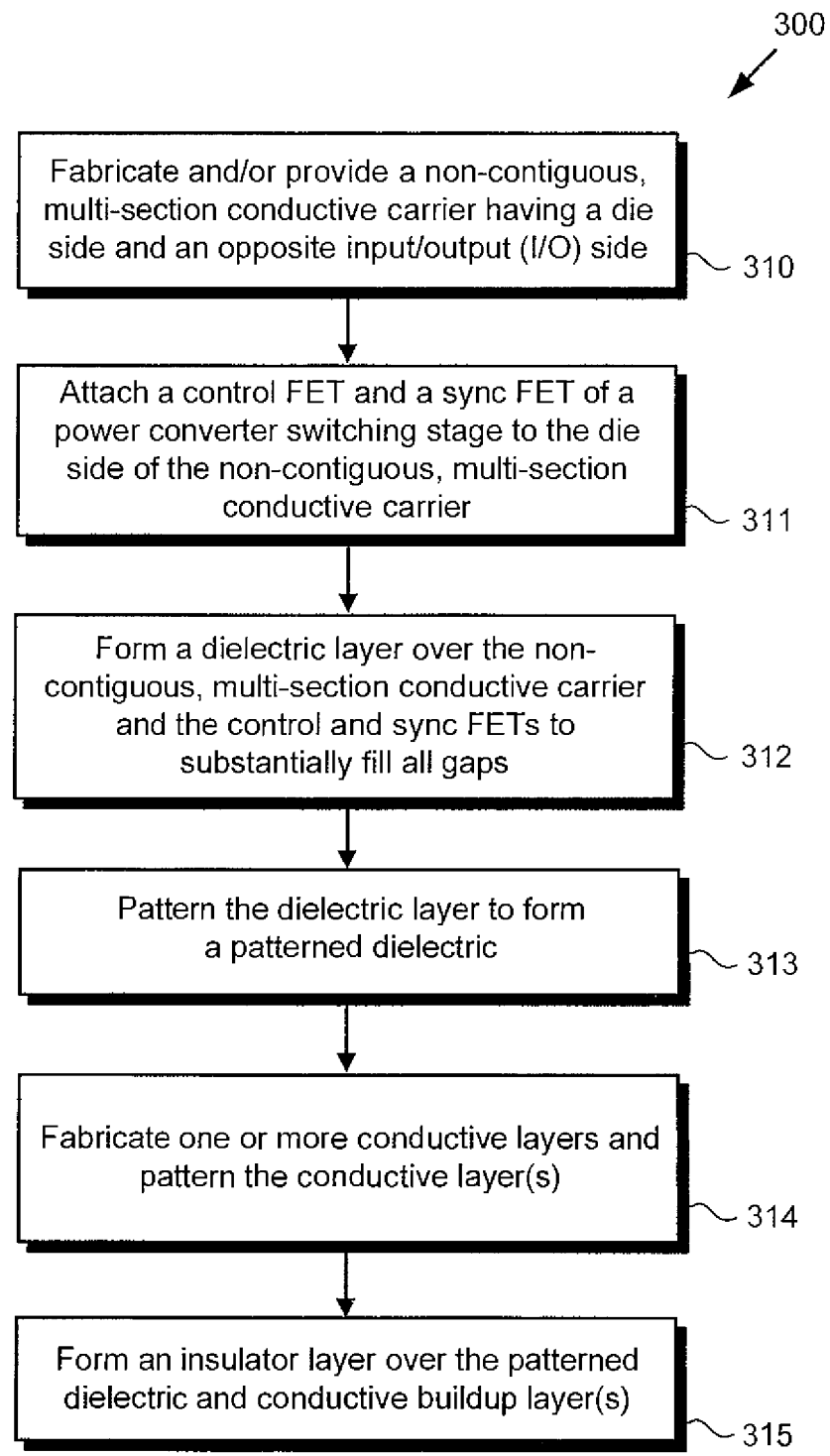
FIG. 3 shows a flowchart presenting an exemplary method for fabricating a semiconductor package according to one implementation of the present disclosure.

Referring to FIG. 3, FIG. 3 shows flowchart 300 presenting an exemplary method for fabricating a semiconductor package according to one implementation of the present disclosure. It is noted that the method described by flowchart 300 is performed on a portion of a conductive carrier structure, which may be a semiconductor package lead frame, or may take the form of a conductive sheet or plate, for example.

Figure 4A:
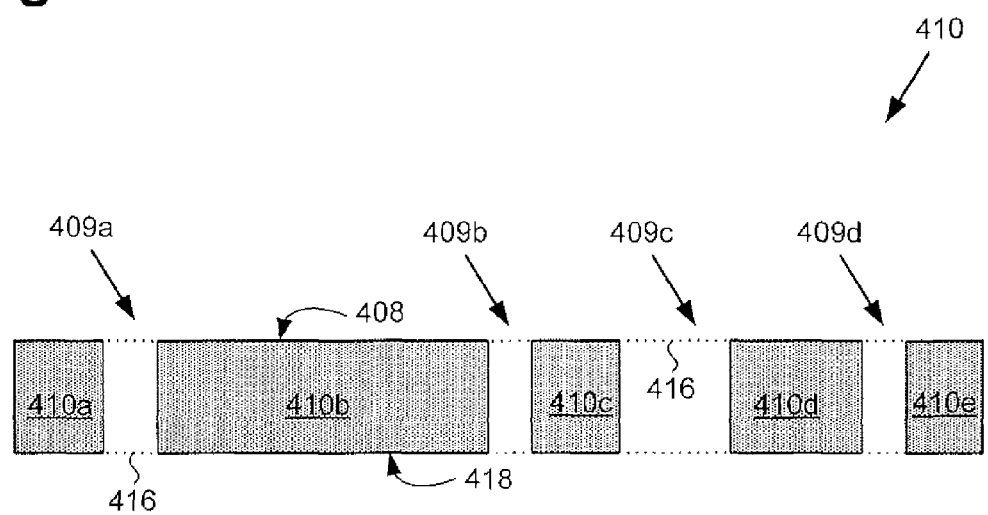
FIG. 4A illustrates a result of performing of an initial action according to the flowchart of FIG. 3 in accordance with one implementation of the present disclosure.

With respect to FIGS. 4A-4F, structures 410 through 415 shown respectively in those figures illustrate the result of performing the method of flowchart 300 according to one implementation of the present disclosure. For example, FIG. 4A represents non-contiguous, multi-section, conductive carrier 410 including conductive carrier sections 410a, 410b, 410c, 410d, and 410e (hereinafter "conductive carrier sections 410a-410e") having die side 408 and opposite I/O side 418 (action 310), structure 411 shows non-contiguous, multi-section conductive carrier 410 after attachment to a control FET and a sync FET (action 311), structure 412 shows structure 411 after the formation of a dielectric layer (action 312), and so forth. It is noted that non-contiguous, multi-section conductive carrier 410 including conductive carrier sections 410a-410e, in FIGS. 4A through 4F, corresponds to conductive carrier 210 including conductive carrier sections 210a-210e, in FIG. 2.

Referring to flowchart 300, in FIG. 3, in combination with FIG. 4A, flowchart 300 begins with fabricating and/or providing a non-contiguous, multi-section conductive carrier 410 including conductive carrier sections 410a-410e and having die side 408 and opposite I/O side 418 (action 310). As shown in FIG. 4A, non-contiguous, multi-section conductive carrier 410 is represented as a pre-patterned conductive sheet or plate having die side 408, I/O side 418, and gaps 409a, 409b, 409c, and 409d (hereinafter "gaps 409a-409d") pre-patterned between respective conductive carrier sections 410a-410e and extending through the entire thickness of the conductive carrier between die side 408 to I/O side 418.

It is noted that conductive carrier sections 410a-410e are shown as connected by dashed lines 416 to indicate that gaps 409a-409d may be visible in FIGS. 4A-4F due to the cross-sectional perspective viewed in those figures, but do not extend through conductive carrier 410 in a direction perpendicular to the plane of the page of FIGS. 4A-4F. Thus non-contiguous, multi-section conductive carrier 410 may be made from a lead frame that is fully patterned to provide conductive carrier sections 410a-410e. Fully patterned conductive carrier 410 may be formed of any conductive material having a suitably low electrical resistance. Examples of materials from which fully patterned, non-contiguous, multi-section conductive carrier 410 may be formed include copper (Cu), aluminum (Al), or a conductive alloy. In one implementation, as noted above, fully patterned conductive carrier 410 may be implemented using a semiconductor package lead frame.

Although the present exemplary implementation shows non-contiguous, multi-section conductive carrier 410 as including gaps 409a-409d, in other implementations, non-contiguous, multi-section conductive carrier 410 may have more, or fewer, gaps than gaps 409a-409d. Moreover, although not shown in the present figures, in some implementations, non-contiguous, multi-section conductive carrier 410 may include a barrier metal layer formed on one or both of die side 408 and I/O side 418. Such a barrier metal layer may be formed of nickel-gold (NiAu) or nickel-palladium-gold (NiPdAu), for example. In some implementations, such a barrier metal layer may serve as an etching mask during patterning of non-contiguous, multi-section conductive carrier 410. Thereafter, such a barrier metal layer can provide a solderable surface at one or both of die side 408 and I/O side 418 of non-contiguous, multi-section conductive carrier 410.

Figure 4B:
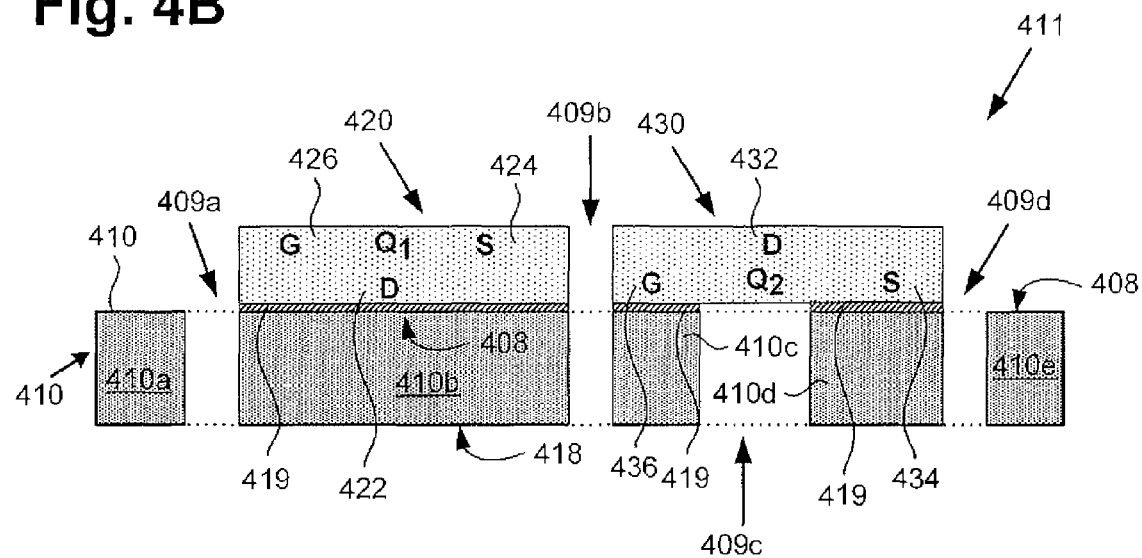
FIG. 4B illustrates a result of performing of a subsequent action according to the flowchart of FIG. 3 in accordance with one implementation of the present disclosure.

Moving to structure 411 in FIG. 4B with ongoing reference to FIG. 3, flowchart 300 continues with attaching control FET 420 ($Q_1$) and sync FET 430 ($Q_2$) to non-contiguous, multi-section conductive carrier 410 (action 311). Control FET 420 includes drain 422, source 424, and gate 426, while sync FET 430 includes drain 432, source 434, and gate 436. As shown in FIG. 4B, control FET 420 and sync FET 430 are attached to die side 408 of non-contiguous, multi-section conductive carrier 410 by electrically conductive die attach material 419.

Electrically conductive die attach material 419 may be any suitable substance, such as a conductive epoxy, solder, a conductive sintered material, or a diffusion bonded material, formed to a thickness of at least 10 μm, for example. Control FET 420 and sync FET 430 are shown as power FETs having a vertical topology. That is to say, source 424 and gate 426 are situated on the same side of control FET 420, while drain 422 is situated on an opposite side of control FET 420. Similarly, source 434 and gate 436 are situated on the same side of sync FET 430, while drain 432 is situated on an opposite side of sync FET 430.

In one implementation, respective control and sync FETs 420 and 430 may take the form of group IV material based vertical FETs, such as silicon vertical MOSFETs for example. However, in other implementations, respective control and sync FETs 420 and 430 may take the form of group III-V based power FETs, such as GaN or other III-Nitride based FETs.

It is noted that control FET 420 and sync FET 430 are flipped relative to each other. That is to say, control FET 420 is disposed on non-contiguous, multi-section conductive carrier 410 in a "face up" orientation in which drain 422 is attached to die side 408 of conductive carrier section 410b, while sync FET 430 is oriented "face down" such that gate 436 and source 434 are attached to die side 408 of respective conductive carrier sections 410c and 410d. Moreover, and as shown in FIG. 4B, sync FET 430 is disposed over gap 409c such that gap 409c is situated between the attachment of source 434 to die side 408 of conductive carrier section 410d and the attachment of gate 436 to die side 408 of conductive carrier section 410c. Control FET 420, sync FET 430, and electrically conductive die attach material 419 correspond respectively to control FET 220, sync FET 230, and electrically conductive die attach material 219, in FIG. 2.

Figure 4C:
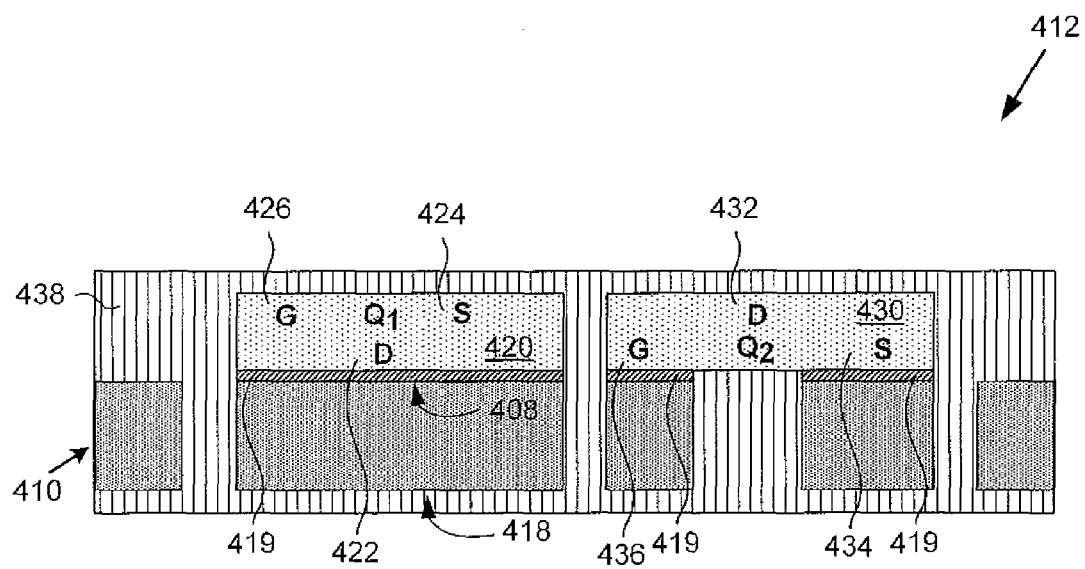
FIG. 4C illustrates a result of performing of a subsequent action according to the flowchart of FIG. 3 in accordance with one implementation of the present disclosure.

As shown by structure 412 in FIG. 4C, flowchart 300 continues with forming dielectric layer 438 over non-contiguous, multi-section conductive carrier 410, control FET 420, and sync FET 430 (action 312). As shown in FIG. 4C, in one implementation, dielectric layer 438 may be formed at die side 408 and I/O side 418 of non-contiguous, multi-section conductive carrier 410. Formation of dielectric layer 438 may be performed through lamination of a pre-formed dielectric layer onto I/O side 418 and/or die side 408 of non-contiguous, multi-section conductive carrier 410, control FET 420, and sync FET 430. Such a pre-formed dielectric layer may be cut or otherwise separated from a pre-formable dielectric material, for example an epoxy-phenolic or cyanate ester-epoxy build-up material or any other pre-formable dielectric utilized in laminate substrate technology. In one implementation, dielectric layer 438 may be formed of a B-stage polymeric material cured during lamination. As a result, and as shown in FIG. 4C, dielectric layer 438 can substantially fill gaps 409*a*-409*d* appearing in FIGS. 4A and 4B.

Figure 4D:
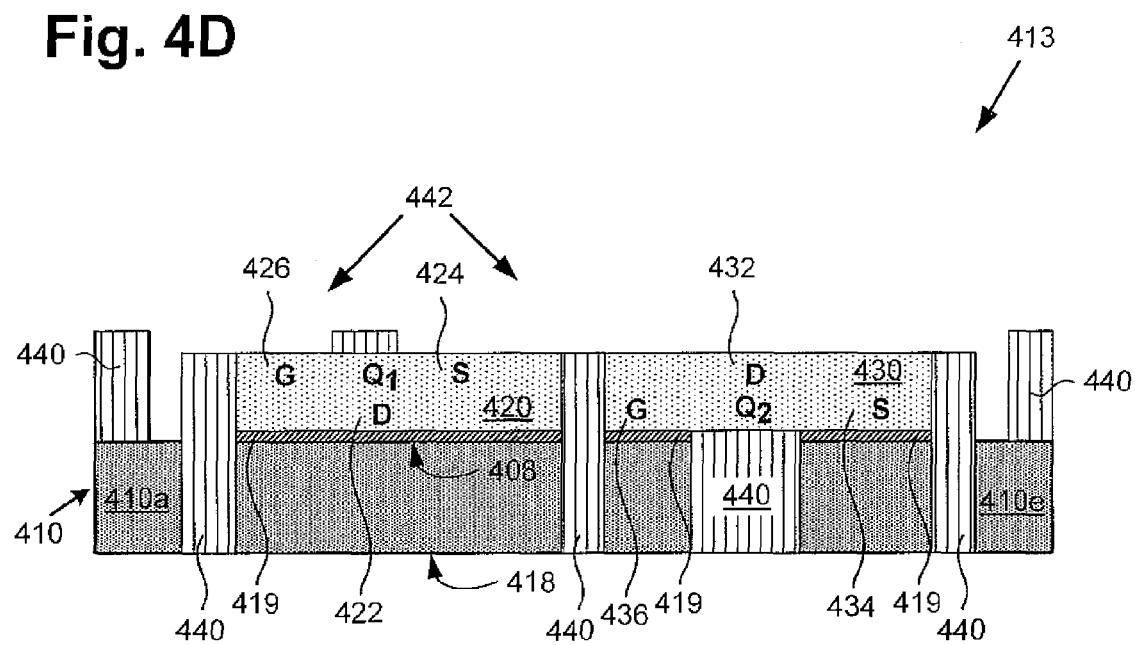
FIG. 4D illustrates a result of performing of a subsequent action according to the flowchart of FIG. 3 in accordance with one implementation of the present disclosure.

Referring to FIG. 4D, flowchart 300 continues with patterning of dielectric layer 438 to form patterned dielectric 440 (action 313). Patterned dielectric 440 may be produced so as to provide windows 442. Patterning of dielectric layer 438 to form patterned dielectric 440 including windows 442 can be performed using any known technique, such as laser or mechanical drilling, for example. Patterned dielectric 440 includes windows 442 exposing portions of die side 408 of conductive carrier sections 410*a* and 410*e*, as well as exposing source 424 and gate 426 of control FET 420, and drain 432 of sync FET 430. In addition, according to the exemplary implementation shown in FIG. 4D, patterning of dielectric layer 438 to produce patterned dielectric 440 results in removal of dielectric material from I/O side 418 of non-contiguous, multi-section conductive carrier 410. Patterned dielectric 440 corresponds to patterned dielectric 240, in FIG. 2.

Figure 4E:
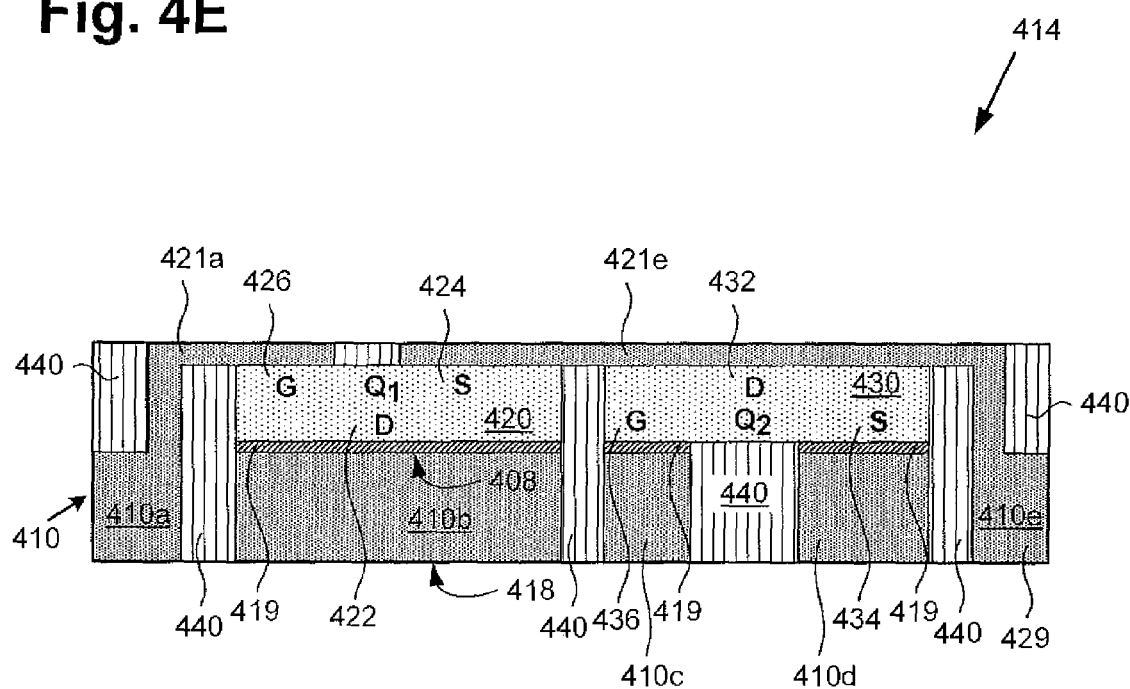
FIG. 4E illustrates a result of performing of a subsequent action according to the flowchart of FIG. 3 in accordance with one implementation of the present disclosure.

Moving to structure 414 in FIG. 4E, flowchart 300 continues with fabrication of one or more conductive layers over patterned dielectric 440, and patterning of the conductive layer(s) to form conductive carrier buildup regions 421*a* and 421*e* (action 314). The conductive layer(s) may be formed of Cu or Al, for example, or may be formed from a metal alloy, such as a metal alloy including Cu and Ni, for example. Such conductive layer or layers may be built up using any suitable technique, such as electrochemical deposition or an electrolytic plating process, for example. After build up, the conductive layer or layers are patterned to form conductive carrier buildup regions 421*a* and 421*e*. Conductive carrier buildup regions 421*a* and 421*e* correspond respectively to conductive carrier buildup regions 221*a* and 221*e*, in FIG. 2.

It is noted that control FET 420 and sync FET 430 are substantially embedded in non-contiguous, multi-section conductive carrier 410 including conductive carrier buildup regions 421*a* and 421*e*. As a result, conductive carrier section 410*e* including conductive carrier buildup region 421*e* can be utilized to electrically connect source 424 of control FET 420 to drain 432 of sync FET 430. In addition, conductive carrier section 410*e* can be used to provide switch node contact 429. Moreover, patterned dielectric can 440 be utilized to provide electrical isolation of each of conductive carrier sections 410*a*-410*e* from the others.

Figure 4F:
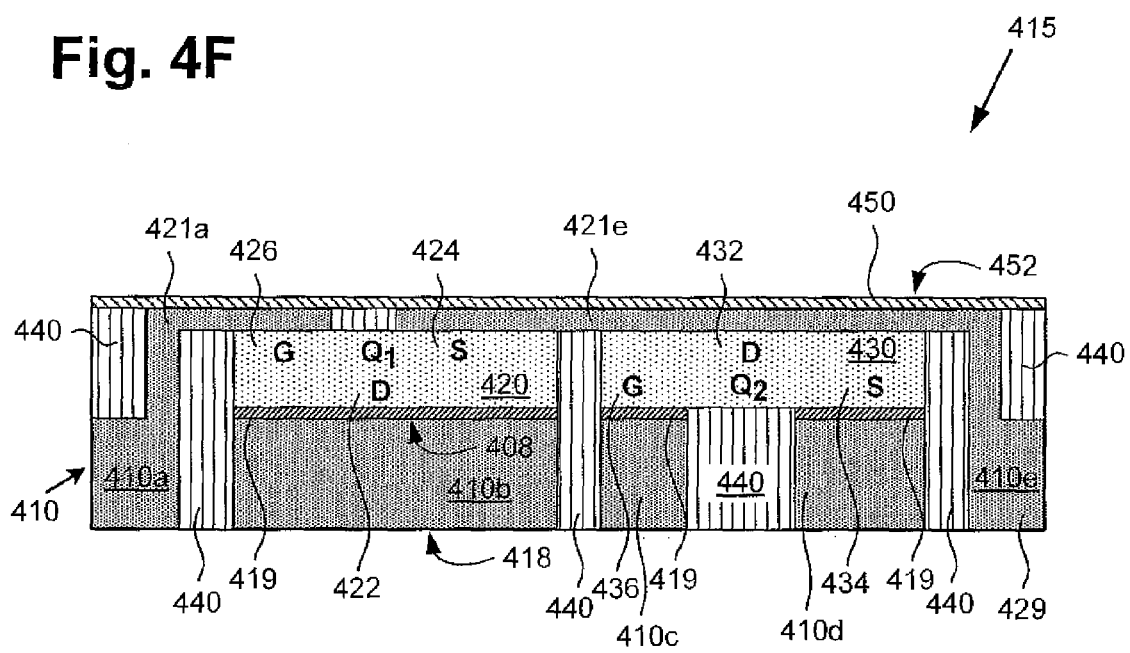
FIG. 4F illustrates a result of performing of a final action according to the flowchart of FIG. 3 in accordance with one implementation of the present disclosure.

Continuing to structure 415 in FIG. 4F, flowchart 300 continues with forming insulator layer 450 over patterned dielectric 440 and conductive carrier buildup regions 421*a* and 421*e* (action 315). Insulator layer 450 may be formed as a blanket layer of solder resist, for example, which provides surface 452. Insulator layer 450 providing surface 452 corresponds to insulator layer 250 providing surface 252, in FIG. 2.

Figure 5:
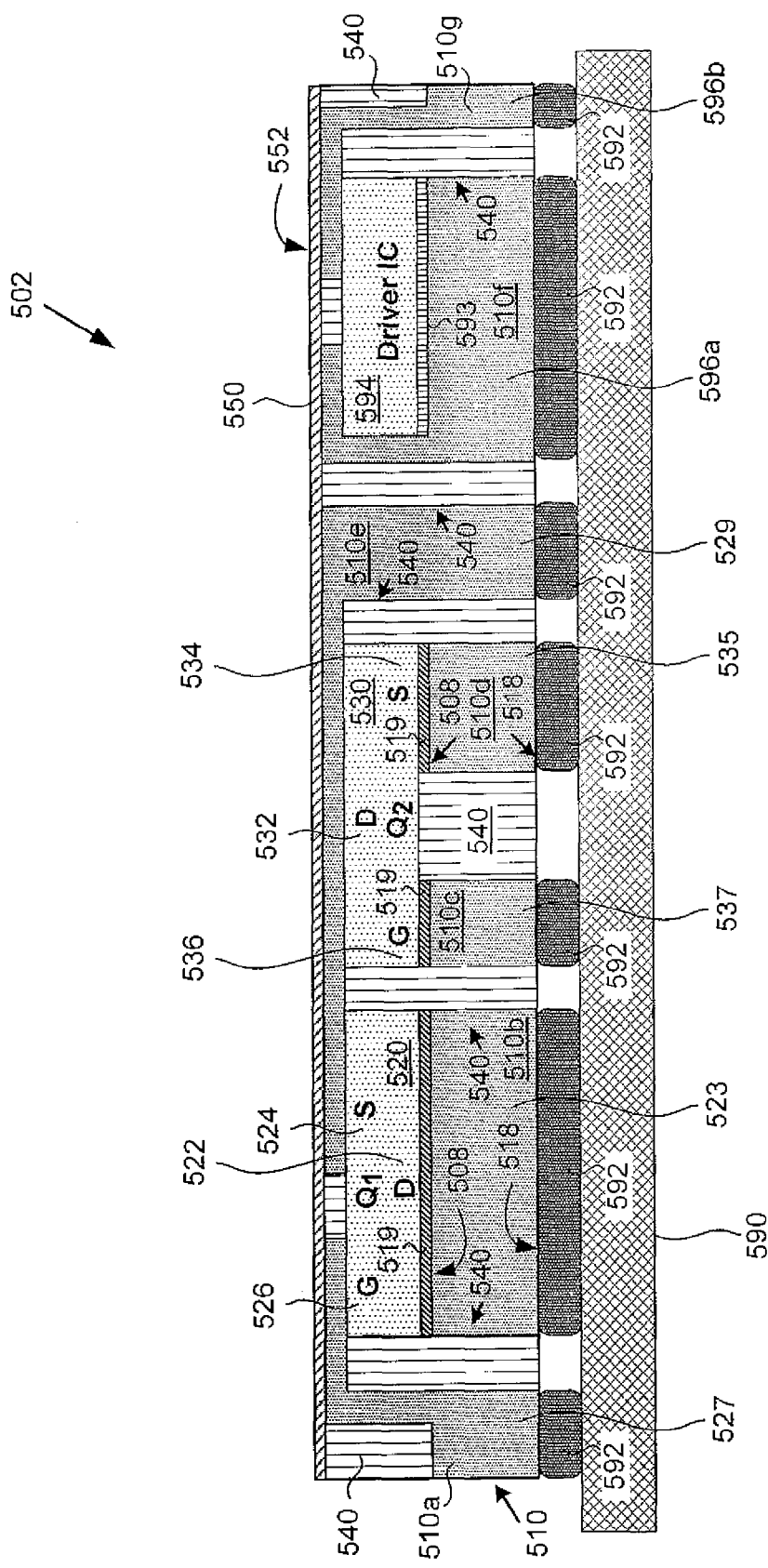
FIG. 5 shows an exemplary representation of a packaging solution according to another implementation of the present disclosure.

Although the implementations shown and described by reference to FIGS. 2, 3, and 4A-4F result in an MCM, such as semiconductor package 201, in FIG. 2, configured to enclose power switching stage 101, in FIG. 1, in some applications, it may be desirable to produce a semiconductor package corresponding to MCM 102. An example implementation of such an MCM package is shown by FIG. 5. One of ordinary skill in the art will readily understand that the exemplary method outlined by flowchart 300, in FIG. 3, can be suitably adapted to produce the exemplary MCM package structure shown in FIG. 5.

FIG. 5 shows a cross-sectional view of semiconductor package 502 attached to mounting surface 590, such as a PCB for example, by solder bodies 592. Semiconductor package 502 includes fully patterned or multi-section conductive carrier 510 having die side 508 and opposite I/O side 518, and including conductive carrier sections 510*a*, 510*b*, 510*c*, 510*d*, 510*e*, 510*f*, and 510*g*. As shown in FIG. 5, the fully patterned or multi-section conductive carrier 510 is a non-contiguous conductive carrier, and is made up of patterned and disjointed sections that are housed within semiconductor package 502, and that are in electrical communication only through mounting surface 590. The non-contiguous, fully patterned or multi-section conductive carrier 510 is also referred to simply as a "conductive carrier" in the present application.

Semiconductor package 502 further includes control FET 520 ($Q_1$) having drain 522, source 524, and gate 526, as well as sync FET 530 ($Q_2$) having drain 532, source 534, and gate 536. Control FET 520 and sync FET 530 are specific examples of power transistors used for illustrative purposes in the present application. However, it is manifest that other types of power transistors can be used as well without departing from the scope of the present inventive concepts. Thus, control FET 520 may be referred to as control transistor and sync FET 530 may be referred to as sync transistor in the present application. Source, drain, and gate of either control FET and/or sync FET may be referred to as a transistor terminal. A control transistor terminal may refer to source, drain, or gate of the control transistor, i.e. control FET 520 in the present example. Likewise, a sync transistor terminal may refer to source, drain, or gate of the sync transistor, i.e. sync FET 530 in the present example. Moreover, semiconductor package 502 may be referred to as a "power semiconductor package" in the present application.

As shown in FIG. 5, drain 522 of control FET 520 is attached to die side 508 of conductive carrier section 510*b*, and source 534 of sync FET 530 is attached to die side 508 of conductive carrier section 510*d*. Semiconductor package 502 also includes driver IC 594 for driving at least one of control FET 520 and sync FET 530. In addition, semiconductor package 502 includes electrically conductive, die attach material 519, patterned dielectric 540, and insulator layer 550 providing surface 552.

Also included as part of semiconductor package 502 are drain contact 523 of control FET 520, source contact, 535 of sync FET 530, gate contacts 527 and 537, switch node contact 529, I/O contacts 596*a* and 596*b* of driver IC 594, and die attach material 593 for attaching driver IC 594 to conductive carrier section 510*f*. It is noted that, depending on the desired implementation, die attach material 593 may be an electrically conductive die attach material or a dielectric die attach material.

Conductive carrier section 510*b*, control FET 520, conductive carrier section 510*d*, sync FET 530, conductive carrier sections 510*a*, 510*c*, and 510*e*, and electrically conductive die attach material 519 correspond respectively to conductive carrier section 210*b*, control FET 220, conductive carrier section 210*d*, sync FET 230, conductive carrier sections 210*a*, 210*c*, and 210*e*, and electrically conductive die attach material 219, in FIG. 2. In addition, patterned dielectric 540, contacts 523, 527, 529, 535, and 537, and insulator layer 550, in FIG. 5, correspond respectively to patterned dielectric 240, contacts 223, 227, 229, 235, and 237, and insulator layer 250, in FIG. 2. Moreover, it is noted that semiconductor package 502 including driver IC 594, in FIG. 5, corresponds in general to MCM 102 including driver IC 194, in FIG. 1.

According to the implementation shown in FIG. 5, conductive carrier section 510e advantageously provides switch node contact 529 and thereby establishes the electrical connection between source 524 of control FET 520 and drain 532 of sync FET 530. Conductive carrier section 510e is also referred to as a switch node section of the conductive carrier. Patterned dielectric 540 can be used to protect driver IC 594 from switching noise that may be present in conductive carrier section 510b, conductive carrier section 510d, and conductive carrier sections 510a, 510c, and 510e by electrically isolating those conductive carrier sections from conductive carrier sections 510f and 510g to which driver IC 594 is connected. In addition, patterned dielectric 540 can be used to electrically isolate conductive carrier sections 510a, 510b, 510c, 510d, and 510e from one another. Moreover, in addition to providing drain contact 523, gate contacts 527 and 537, source contact 535, switch node contact 529, and I/O contacts 596a and 596b, respective conductive carrier sections 510b, 510a, 510c, 510d, 510e, 510f, and 510g provide integrated heat spreading by sinking heat produced by control FET 520, sync FET 530, and control IC 594 into mounting surface 590.

Thus, embedding a power switching stage of a power converter in a conductive carrier utilized as a structural support in a semiconductor package advantageously enables a highly compact semiconductor package design, while concurrently providing thermal protection. In addition, by embedding the power switching stage in the conductive carrier so as to utilize the conductive carrier to provide a switch node coupling a control switch to a sync switch, the present application enables further reductions in package size. For example, a package height, or thickness, resulting from the implementations disclosed in the present application may be less than approximately 0.5 mm, such as a package height or thickness of approximately 0.45 min. Furthermore, use of the conductive carrier to provide the switch node advantageously enables omission of a conductive clip, or any other feature implemented solely or primarily as a switch node electrical connector, from the semiconductor package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A power semiconductor package comprising:
a multi-section conductive carrier;
a first power transistor coupled to a first section of said multi-section conductive carrier;
a second power transistor coupled to a second section of said multi-section conductive carrier;
said multi-section conductive carrier sinking heat generated by said first and second power transistors;
said first and second sections of said multi-section conductive carrier being electrically connected only through a mounting surface attached to said power semiconductor package.

2. The power semiconductor package of claim 1, wherein said first and second power transistors form a power switching stage of a voltage converter.

3. The power semiconductor package of claim 1, wherein said multi-section conductive carrier is made from a patterned lead frame.

4. The power semiconductor package of claim 1, wherein said first power transistor is a control FET.

5. The power semiconductor package of claim 1, wherein said second power transistor is a sync FET.

6. The power semiconductor package of claim 1, wherein said first power transistor is a control FET, and said second power transistor is a sync FET, and wherein a source of said control FET is coupled to a drain of said sync FET.

7. The power semiconductor package of claim 6, wherein said source of said control FET is coupled to said drain of said sync FET through a switch node section of said multi-section conductive carrier.

8. The power semiconductor package of claim 1, further comprising a patterned dielectric situated between a plurality of sections of said multi-section conductive carrier.

9. The power semiconductor package of claim 1, further comprising an insulator layer overlying said multi-section conductive carrier.

10. The power semiconductor package of claim 1, wherein said mounting surface is a printed circuit board (PCB).

11. The power semiconductor package of claim 1, wherein said power semiconductor package is attached to said mounting surface by solder bodies.

12. A method for fabricating a power semiconductor package comprising:
providing a multi-section conductive carrier;
attaching a first power transistor and a second power transistor to said multi-section conductive carrier;
forming a dielectric layer over said multi-section conductive carrier and said first and second power transistors;
fabricating conductive layers of said multi-section conductive carrier over said dielectric layer and said first and second power transistors;
attaching a mounting surface to said multi-section conductive carrier so as to electrically connect said first and second power transistors.

13. The method of claim 12 further comprising forming an insulator layer after said fabricating said conductive layers.

14. The method of claim 12, wherein said first and second power transistors form a power switching stage of a voltage converter.

15. The method of claim 12, wherein said multi-section conductive carrier is made by patterning a lead frame.

16. The method of claim 12, wherein said first power transistor is a control FET.

17. The method of claim 12, wherein said second power transistor is a sync FET.

18. The method of claim 12, wherein said first power transistor is a control FET, and said second power transistor is a sync FET, and wherein a source of said control FET is coupled to a drain of said sync FET.

19. The method of claim 18, wherein said source of said control FET is coupled to said drain of said sync FET through a switch node section of said multi-section conductive carrier.

20. The method of claim 12, wherein said mounting surface is a printed circuit board (PCB).

* * * * *